Feb. 13, 1962 M. E. JONES 3,021,462

OHMIC CONNECTIONS FOR SILICON SEMICONDUCTOR DEVICES

Original Filed Jan. 4, 1957

INVENTOR

Morton E. Jones

BY

Stevens, Davis, Miller & Mosher

ATTORNEYS

United States Patent Office 3,021,462
Patented Feb. 13, 1962

3,021,462

OHMIC CONNECTIONS FOR SILICON SEMICONDUCTOR DEVICES

Morton E. Jones, Dallas, Tex., assignor to Texas Instruments, Incorporated, Dallas, Tex., a corporation of Delaware Original application Jan. 4, 1957, Ser. No. 632,547, now Patent No. 2,929,137, dated Mar. 22, 1960. Divided and this application Mar. 19, 1959, Ser. No. 803,817
5 Claims. (Cl. 317—240)

This invention relates to improvements in ohmic connections for silicon semiconductor devices. This application is a division of applicant's copending application Serial No. 632,547, filed January 4, 1957, and now Patent No. 2,929,137.

Typical of silicon semiconductor devices are silicon transistors which are comprised of a small bar of silicon about .030 by .030 inch in cross-section and about .25 inch in length. This small silicon bar has end portions of one type (p or n) of electrical conductivity and a narrow layer extending transversely somewhere near the mid-point of the opposite type of electrical conductivity. Electrical connections must be made to this intermediate layer, which is known as the base of the transistor, and to the end portions, which are known as the emitter and the collector of the transistor. Provisions for supporting and enclosing the bar are also provided.

This invention is concerned with the making of the connections to the ends of the silicon transistor bar, and since no rectification of the electrical current is desired at these points, these connections are known as ohmic or non-rectifying connections. The connection that must be made to the base layer of the bar presents its own peculiar problems, but this invention is not concerned with them.

Prior to this invention, many different methods of forming the ohmic connections at the ends of silicon transistor bars have been proposed and some of them have been commercially used. However, considerable difficulty has been encountered in making these connections because it is difficult to get any type of solder to stick to silicon metal; high temperatures tend to injure or destroy the very characteristics that it is necessary for the silicon bars to have in order for them to function as transistors; and silicon has a relatively low coefficient of expansion, whereas most metals have a much higher coefficient of expansion, so that changes in temperature of the device normally encountered in the course of affixing the ohmic contacts to the silicon bar tend to cause the contact to crack loose from the silicon.

Some success has been had in affixing ohmic connections to silicon transistor bars by electroplating the ends of the bars with rhodium or nickel and soldering a suitable connecting wire to this coating. However, these contacts are quite susceptible to cracking and therefore unreliable.

The present invention provides a simpler, easier and quicker method for attaching electroconductive leads to the ends of silicon bars. The attachment is accomplished without damage to the characteristics of the bars and is quite permanent.

Briefly, the present method of attaching electrical connections to the ends of silicon bars consists in dipping the ends of the silicon bars into an alloy consisting of approximately 90% tin and 10% gold, to which may be added a small amount of an element capable of effecting the conductivity characteristics of silicon. The impurity, such as antimony, arsenic, aluminum or indium, is matched to the conductivity-affecting impurity in the end of the bar being coated so that the conductivity characteristic of this end of the bar will not be changed and there will be no tendency to form a rectifying junction at the point of connection.

The dipping of the ends of the silicon bars, and the resultant coating thereof by this alloy, is accomplished in the presence of cesium fluoride, which acts as a flux, and at a temperature slightly above the melting point of the cesium fluoride, which is 684° C. The ends of the transistor bars are preferably dipped into the alloy for only a long enough period of time for them to acquire a coating and are held during the time they are dipped by tweezers or tongs or other means that will act as a heat sink so as to prevent overheating of the transistor bars. The operation is also conducted in the presence of helium or argon or other inert gas.

The alloy coating forms a satisfactory base for the attachment of electrical connections by the use of a low temperature solder, and thus, again, changes of temperature high enough to cause cracking are avoided.

It will immediately be apparent to those skilled in this art that numerous modifications in the method and the consequent article of this invention may be made without departing from the spirit of this invention.

Further details and advantages of the invention will be apparent from the following detailed description of the practice of the preferred embodiment thereof as illustrated in the accompanying drawing.

Figure 1:
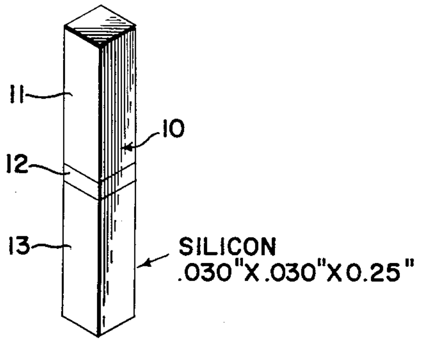
FIGURE 1 is a perspective view of a typical silicon transistor bar.
Figure 2:
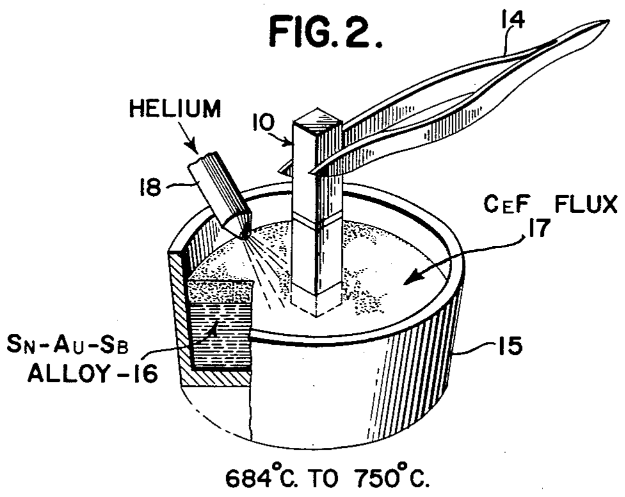
FIGURE 2 is a perspective view, partly in section, illustrating the operation of dipping one end of the silicon transistor bar into the alloy of this invention.

As previously mentioned, a typical silicon transistor bar 10 is about .030 by .030 inch in cross-section by about 0.25 inch in length, and consists of an end section 11, known as an emitter section, separated by a thin layer 12, known as the base section, from another end section 13, known as the collector section. An n-p-n transistor bar has been selected for use in illustrating the preferred embodiment of this invention, and is shown in FIGURE 1. It will be understood, however, that ohmic connections may be made to many other forms of silicon semiconductor elements in accordance with the principles of this invention.

In accordance with the illustrated embodiment of this invention, the silicon transistor bars illustrated in FIGURE 1 are picked up individually by a pair of tweezers 14, and the end to be coated is dipped into a crucible 15 which contains an alloy 16, on the surface of which there is floated a quantity of cesium fluoride flux 17. The alloy is preferably 89.5% tin, 10% gold and 0.5% antimony. The silicon bar is allowed to remain only briefly in the alloy, and then as soon as a coating of the alloy will adhere to it, it is withdrawn and allowed to cool. During the dipping operation, the temperature of the alloy is maintained slightly above 684° C., and preferably between 684° C. and 750° C. Temperatures somewhat above this can be used, but are generally considered less satisfactory, since they tend to overheat the transistor bars. During the dipping operation, an atmosphere of helium or argon or some other inert gas is maintained in the area where the dipping takes place. Any suitable and well known means for maintaining this atmosphere around the area of dipping may be utilized, as, for example, a nozzle 18 through which a stream of helium is continuously directed into the crucible 15.

Visual inspection of the bars will reveal whether or not they have been coated by the alloy, and the length of time during which they are allowed to remain in the alloy can be adjusted until it is just sufficient to cause the silicon to be wet and coated by the alloy. The surface of the alloy becomes encrusted from time to time with the flux, but this may be removed by skimming the surface with a quartz rod.

Figure 3:
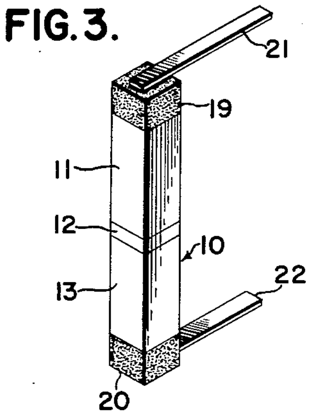
FIGURE 3 is a perspective view of a completed silicon bar, with the two ohmic end contacts having been made.

The resultant coated bar, as shown in FIGURE 3, has a coating on each end at 19 and 20, and to these coated ends electrical connections 21 and 22 may be attached by means of soft (low melting point) solder.

Since cesium fluoride is soluble in water, it may be removed by washing the coated transistor bars several times in distilled water and then drying them. The coated ends of the bars will ordinarily not require fluxing to cause soft solder to adhere thereto, but solder flux can be used and removed in the usual way, if desired. Apparently, the tin-gold alloy of this invention tends to alloy itself to a certain extent with the ends of the silicon bars, even at the relatively low temperatures at which the coating takes place, thus forming good, firm contacts.

The final electrical connections 21 and 22 may be of copper, steel, tungsten, or any one of the various iron-nickel alloys. It has been found that an iron-nickel-cobalt alloy coated with gold is very satisfactory for this purpose. A satisfactory soft solder such as pure tin or a tin-lead solder may be used for attaching the final connections.

What is claimed is:

1. A silicon semiconductor element, a portion of which is coated with an adhering coating of an alloy comprised of approximately 90% tin and the remainder substantially entirely gold, and an electrical connection affixed to said coating.

2. A silicon semiconductor element, a portion of which is coated with an adhering coating of an alloy consisting essentially of 90% tin and the remainder gold with a minor percentage of conductivity-affecting material which matches the conductivity-affecting material of the semiconductor element, and an electrical connection affixed to said coating.

3. A silicon semiconductor element, a portion of which is coated with an adhering coating of an alloy consisting essentially of 10% gold and the remainder tin with a minor percentage of conductivity-affecting material which matches the conductivity-affecting material of the semiconductor element, and an electrical connection affixed to said coating.

4. A silicon semiconductor element, a portion of which is coated with an adhering coating of an alloy consisting essentially of 90% tin and 10% gold with a minor percentage of conductivity-affecting material which matches the conductivity-affecting material of the semiconductor element, and an electrical connection affixed to said coating.

5. A silicon semiconductor element having a center section and two opposite ends, said two opposite ends only being coated with an adhering coating of an alloy consisting essentially of 90% tin and 10% gold with a minor percentage of conductivity-affecting material which matches the conductivity-affecting material of the semiconductor element, and two electrical connections severally affixed to the coated ends of said semiconductor element.

References Cited in the file of this patent

UNITED STATES PATENTS

| | | |
|---|---|---|
| 2,784,300 | Zuk | Mar. 5, 1957 |
| 2,796,563 | Ebers et al. | June 18, 1957 |